(12) United States Patent
Su (10) Patent No.: US 11,605,438 B2
(45) Date of Patent: Mar. 14, 2023

(54) MEMORY DEVICE FOR IMPROVING WEAK-PROGRAM OR STUCK BIT

(71) Applicant: eMemory Technology Inc., Hsinchu (TW)

(72) Inventor: Ting-Ting Su, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 17/471,168

(22) Filed: Sep. 10, 2021

(65) Prior Publication Data

US 2022/0157394 A1 May 19, 2022

Related U.S. Application Data

(60) Provisional application No. 63/113,978, filed on Nov. 16, 2020.

(51) Int. Cl.
| | |
|---|---|
| *G11C 16/34* | (2006.01) |
| *H01L 27/11519* | (2017.01) |
| *H01L 29/423* | (2006.01) |
| *H01L 29/788* | (2006.01) |
| *H01L 27/11521* | (2017.01) |
| *G11C 16/04* | (2006.01) |

(52) U.S. Cl.
CPC .... *G11C 16/3477* (2013.01); *H01L 27/11519* (2013.01); *H01L 27/11521* (2013.01); *H01L 29/42328* (2013.01); *H01L 29/788* (2013.01); *G11C 16/0433* (2013.01)

(58) Field of Classification Search
CPC ............ G11C 16/3477; G11C 16/0433; H01L 27/11519; H01L 27/11521; H01L 29/42328; H01L 29/788; H01L 27/11558; H01L 29/42324; H01L 29/7881
USPC ...................................... 365/185.3
See application file for complete search history.

(56) References Cited

U.S. PATENT DOCUMENTS

| 5,856,943 | A | 1/1999 | Jeng | |
| 9,899,538 | B1 * | 2/2018 | Chang | .................... G11C 16/26 |
| 10,083,757 | B2 | 9/2018 | Chen et al. | |
| 10,559,700 | B2 * | 2/2020 | Liu | .................... H01L 29/42324 |

(Continued)

FOREIGN PATENT DOCUMENTS

| EP | 0530644 | 10/1997 |
| JP | 2002511189 A | * 4/2002 |

(Continued)

*Primary Examiner* — Fernando Hidalgo
(74) *Attorney, Agent, or Firm* — JCIPRNET (57) ABSTRACT

Provided is a memory device including a memory structure including a substrate, a channel region, first and second doped regions, a floating gate and a dielectric layer. The channel region is disposed on the substrate. The first and the second doped regions are disposed on the substrate and respectively located at two sides of the channel region. The floating gate is disposed on the channel region. The dielectric layer is disposed between the floating gate and the channel region, the first doped region and the second doped region. The floating gate and the first doped region are partially overlapped, and/or the floating gate and the second doped region are not overlapped and a sidewall of the floating gate adjacent to the second doped region and a boundary between the second doped region and the channel region are separated by a distance.

18 Claims, 10 Drawing Sheets

(56) References Cited

U.S. PATENT DOCUMENTS

2004/0130934 A1 7/2004 Prall et al.
2019/0228828 A1 7/2019 Yamamoto

FOREIGN PATENT DOCUMENTS

| WO | 2014153810 | 10/2014 | |
|---|---|---|---|
| WO | WO-2018043425 A1 * | 3/2018 | ............. G11C 17/06 |

* cited by examiner

MEMORY DEVICE FOR IMPROVING WEAK-PROGRAM OR STUCK BIT

CROSS REFERENCE TO RELATED APPLICATION

This application claims the priority benefit of U.S. provisional application Ser. No. 63/113,978, filed on Nov. 16, 2020. The entirety of the above-mentioned patent application is hereby incorporated by reference herein and made a part of specification.

BACKGROUND

Technical Field

The present invention relates to a memory device, and particularly relates to a memory device which may improve weak-program or stuck bit (also called as over-erase).

Description of Related Art

A non-volatile memory (NVM) has the advantages of multiple operations such as a program operation, a read operation, an erase operation, etc., and the stored data may not disappear after power-off. Thus, the non-volatile memory has been widely used in personal computers and electronic equipment.

In general, the efficiency of the program operation of the non-volatile memory may be depended on the coupling effect between the gate and the source and the coupling effect between the gate and the drain. Depending on the impact of the manufacturing process on the memory device including the non-volatile memory, in one situation, the initial electron injection point of the non-volatile memory may be too high to allow enough electrons to be injected, and thus weak-program may be occurred during the program operation of the non-volatile memory. In another situation, electrons may not be injected effectively, and thus stuck bit may be occurred during the program operation of the non-volatile memory. As a result, the efficiency of the program operation may be effected by the weak-program or the stuck bit. Therefore, how to effectively improve the weak-program and the stuck bit has become one of the important topics.

SUMMARY

The present invention provides a memory device which may improve the weak-program or the stuck bit.

A memory device of the present invention includes a memory structure. The memory structure includes a substrate, a channel region, a first doped region, a second doped region, a floating gate and a dielectric layer. The channel region is disposed on the substrate. The first doped region and the second doped region are disposed on the substrate and respectively located at two sides of the channel region. The floating gate is disposed on the channel region. The dielectric layer is disposed between the floating gate and the channel region, the first doped region and the second doped region. The floating gate and the first doped region are partially overlapped, or the floating gate and the second doped region are not overlapped and a sidewall of the floating gate adjacent to the second doped region and a boundary between the second doped region and the channel region are separated by a distance in a length direction of the channel region from the top view, or the floating gate and the first doped region are partially overlapped, the floating gate and the second doped region are not overlapped and a sidewall of the floating gate adjacent to the second doped region and a boundary between the second doped region and the channel region are separated by a distance in a length direction of the channel region.

In an embodiment of the memory structure of the present invention, a width the first doped region overlapped with the floating gate is between 0.2 times and 2 times a length of the channel region.

In an embodiment of the memory structure of the present invention, a width of the first doped region is substantially equal to a width of the second doped region.

In an embodiment of the memory structure of the present invention, a width the first doped region overlapped with the floating gate is between 0.2 and 0.5 times a width of the floating gate.

In an embodiment of the memory structure of the present invention, a width of the first doped region is larger than a width of the second doped region.

In an embodiment of the memory structure of the present invention, a width of the first doped layer overlapped with the floating gate is between 0.9 μm and 9 μm.

In an embodiment of the memory structure of the present invention, the distance is between 0.05 and 0.5 times a width of the floating gate.

In an embodiment of the memory structure of the present invention, a width of the second doped region is smaller than a width of the first doped region.

In an embodiment of the memory structure of the present invention, the distance is between 0.05 and 0.5 times a length of the channel region.

In an embodiment of the memory structure of the present invention, a width of the first doped region is substantially equal to a width of the second doped region.

In an embodiment of the memory structure of the present invention, the distance is between 0.225 μm and 2.25 μm.

In an embodiment of the memory structure of the present invention, a dopant concentration of the first doped region is the same as a dopant concentration of the second doped region.

In an embodiment of the memory structure of the present invention, the channel region is undoped.

In an embodiment of the memory structure of the present invention, the substrate comprises a glass substrate and a buffer layer disposed on the glass substrate.

In an embodiment of the memory structure of the present invention, the memory structure further includes a select transistor dispose to be connected in series with the memory structure.

In an embodiment of the memory structure of the present invention, the memory structure further includes a source line connected with the first doped region and a bit line connected to the second doped region, wherein during a program operation of the memory device, the first doped region is configured to receive a first voltage through the source line, the second doped region is configured to receive a second voltage through the bit line, and the first voltage is higher than the second voltage.

In an embodiment of the memory structure of the present invention, the memory structure further includes a bit line connected with the first doped region and a source line connected to the second doped region, wherein during a program operation of the memory device, the first doped region is configured to receive a first voltage through the bit line, the second doped region is configured to receive a second voltage through the source line, and the first voltage is lower than the second voltage.

Based on the above, in the memory device of the present invention, the overlap area between the floating gate and the source is increased and/or the distance between the floating gate and the drain are increased, and thus weak-program during the program operation of the non-volatile memory may be improved. In addition, the overlap area between the floating gate and the drain is increased and/or the distance between the floating gate and the source are increased, and thus stuck bit during the program operation of the non-volatile memory may be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

In addition, in the text, the range represented by "a value to another value" is a summary expression way to avoid listing all the values in the range one by one in the specification. Therefore, the record of a specific numerical range covers any numerical value within the numerical range, as well as a smaller numerical range defined by any numerical value within the numerical range.

In addition, the directional terms mentioned in the text, such as "on" and "under", are merely used to refer to the drawings and are not intended to limit the present invention.

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

In the embodiments of the present invention, by increasing the overlap area between the floating gate and the source and/or increasing the distance between the floating gate and the drain, the weak-program may be effectively improved. In addition, in other embodiments of the present invention, by increasing the overlap area between the floating gate and the drain and/or increasing the distance between the floating gate and the source, the stuck bit may be effectively improved. The memory devices of the embodiments of the present invention will be described in detail below.

Figure 1:
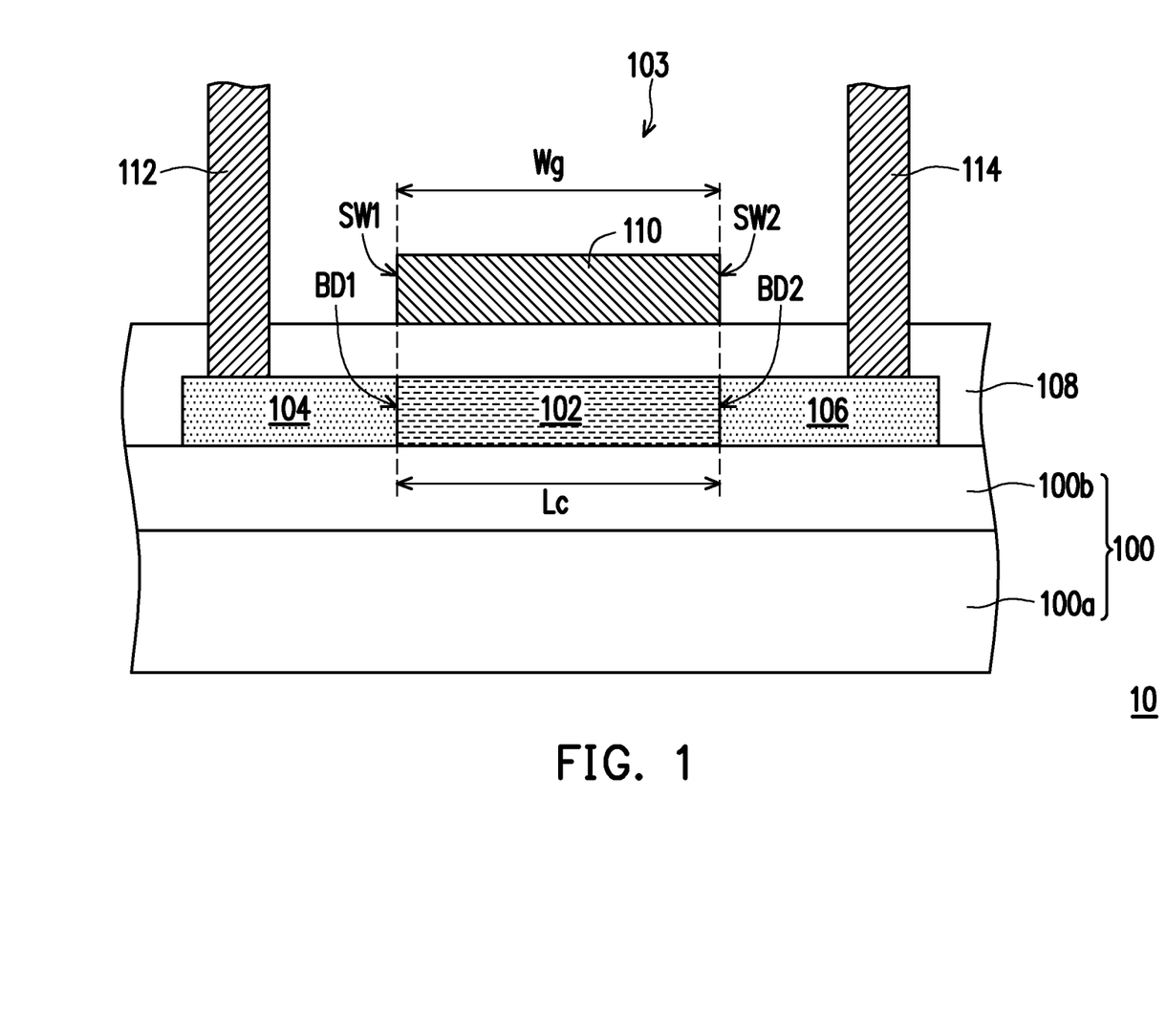
FIG. 1 is a schematic cross-sectional view of a memory device according to a first embodiment of the present invention.

FIG. 1 is a schematic cross-sectional view of a memory device according to a first embodiment of the present invention. Referring to FIG. 1, the memory device 10 includes a memory structure 103 including a substrate 100, a channel region 102, a first doped region 104, a second doped region 106, a dielectric layer 108 and a floating gate 110. In addition, the memory device 10 includes a conductive line 112 connecting to the first doped region 104 and a conductive line 114 connecting to the second doped region 106.

In the memory device 10, the substrate 100 may include a glass substrate 100a and a buffer layer 100b disposed on the glass substrate 100a. The buffer layer 100b may be an oxide layer, but the present invention is not limited thereto. In other embodiments, the glass substrate 100a may be replaced with a silicon substrate. The channel region 102 is disposed on the substrate 100 (the buffer layer 100b). The channel region 102 may be an undoped polysilicon layer, but the present invention is not limited thereto. The first doped region 104 and the second doped region 106 are disposed on the substrate 100 (the buffer layer 100b), and are respectively located at two sides of the channel region 102 to serve as the source and the drain of the memory structure 103. The first doped region 104 and the second doped region 106 have the same dopant concentration and the same conductive type. For example, the first doped region 104 and the second doped region 106 may be P-type doped regions with the same dopant concentration, or the first doped region 104 and the second doped region 106 may be N-type doped regions with the same dopant concentration.

The dielectric layer 108 is disposed on the channel region 102, the first doped region 104 and the second doped region 106. In the present embodiment, the dielectric layer 108 covers the channel region 102, the first doped region 104 and the second doped region 106. That is, the dielectric layer 108 covers the top surface of the channel region 102, the top surface and the sidewall of the first doped region 104, and the top surface and the sidewall of the second doped region 106, but present invention is not limited thereto. The dielectric layer 108 may be an oxide layer, but present invention is not limited thereto.

The floating gate 110 is disposed on the channel region 102. In other words, in the present embodiment, the dielectric layer 108 is disposed between the floating gate 110 and the channel region 102, the first doped region 104 and the second doped region 106 to isolate the floating gate 110 from the channel region 102, the first doped region 104 and the second doped region 106.

In addition, in the present embodiment, a conductive line 112 and a conductive line 114 may be respectively located at two sides of the floating gate 110, and penetrate through the dielectric layer 108 to connect to the first doped region 104 and the second doped region 106, respectively. The conductive line 112 may be used as a source line when the first doped region 104 is used as the source, and the conductive line 114 may be used as a bit line when the second doped region 106 is used as the drain. Alternatively, the conductive line 112 may be used as a bit line when the first doped region 104 is used as the drain, and the conductive line 114 may be used as a source line when the second doped region 106 is used as the source.

In the present embodiment, the floating gate 110 and the first doped region 104 are not overlapped, and the floating gate 110 and the second doped region 106 are not overlapped. In other words, the sidewall SW1 of the floating gate 110 adjacent to the first doped region 104 is aligned with the boundary BD1 between the first doped region 104 and the channel region 102 from the top view, and the sidewall SW2 of the floating gate 110 adjacent to the second doped region 106 is aligned with the boundary BD2 between the second doped region 106 and the channel region 102, from the top view. As a result, in the present embodiment, the width Wg of the floating gate 110 is equal to the channel length Lc of the channel region 102, as shown in FIG. 1. In the text, the term "channel length" means a length of the channel region 102 in a length direction from the first doped region 104 to the second doped region 106 or from the second doped region 106 to the first doped region 104.

Figure 2:
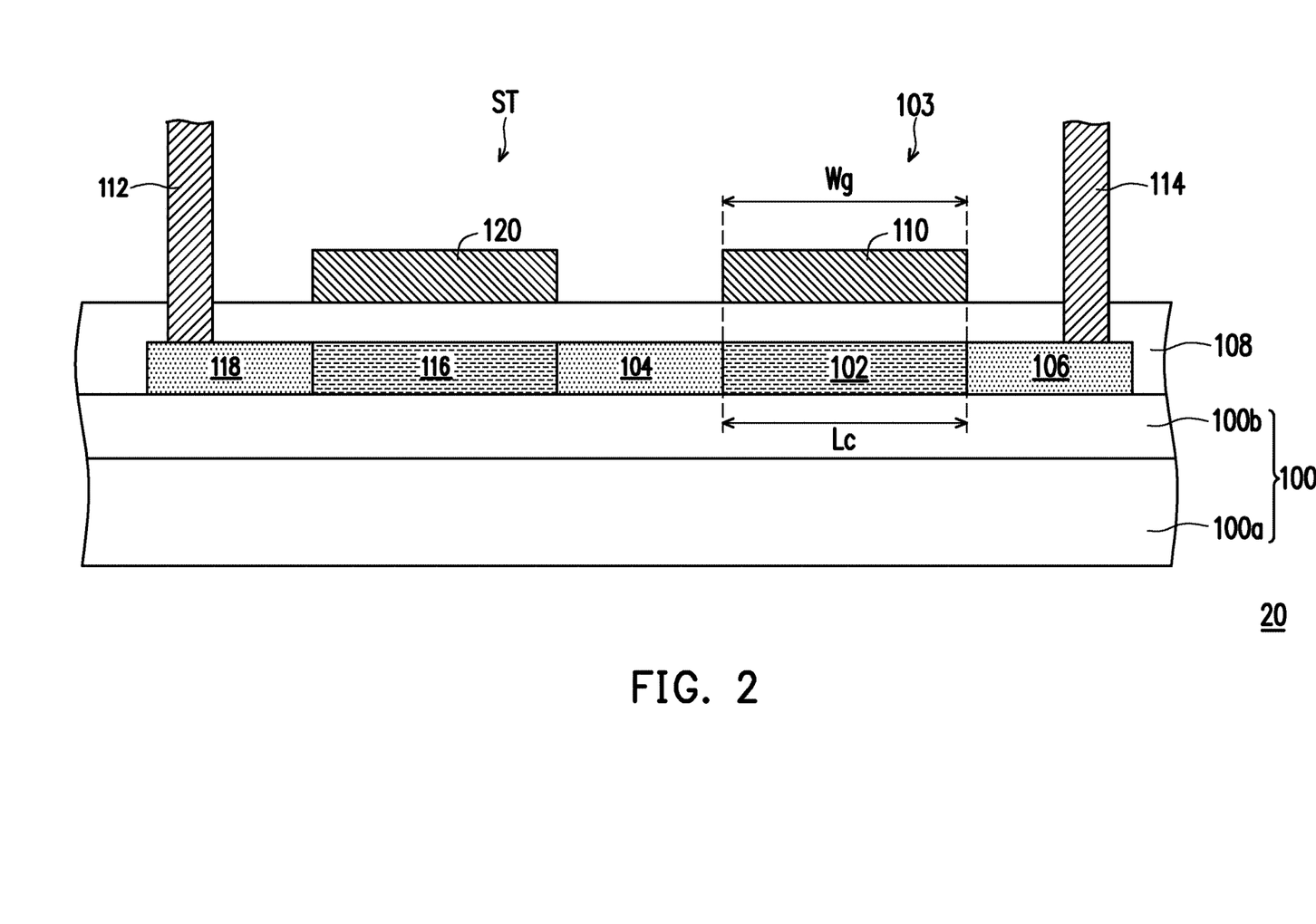
FIG. 2 is a schematic cross-sectional view of a memory device according to a second embodiment of the present invention.

FIG. 2 is a schematic cross-sectional view of a memory device according to a second embodiment of the present invention. Referring to FIG. 2, the difference between the present embodiment and the first embodiment is that: in the present embodiment, in addition to memory structure 103, the conductive line 112 and a conductive line 114, the memory device 20 further includes a select transistor ST disposed to be connected in series with the memory structure 103. The select transistor ST may be disposed between the source of the memory structure and the source line. In the present embodiment, when the first doped region 104 is used as the source of the memory structure 103, the select transistor ST is disposed between the first doped region 104 and the conductive line 112 used as the source line.

In detail, in the present embodiment, the select transistor ST may include a channel region 116, a third doped region 118, a first doped region 104 shared with the memory structure 103, the dielectric layer 108 and a select gate 120. The third doped region 118 is the same as the first doped region 104, and the third doped region 118 and the first doped region 104 may be used as the source and drain of the select transistor ST, respectively. The dielectric layer 108 is disposed between the select gate 120 and the channel region 116 to serve as the gate dielectric layer.

In another embodiment, when the first doped region 104 is used as the drain of the memory structure 103, the select transistor ST is disposed between the second doped region 106 used as the source of the memory structure 103 and the conductive line 114 used as the source line (not shown in figure).

Figure 3:
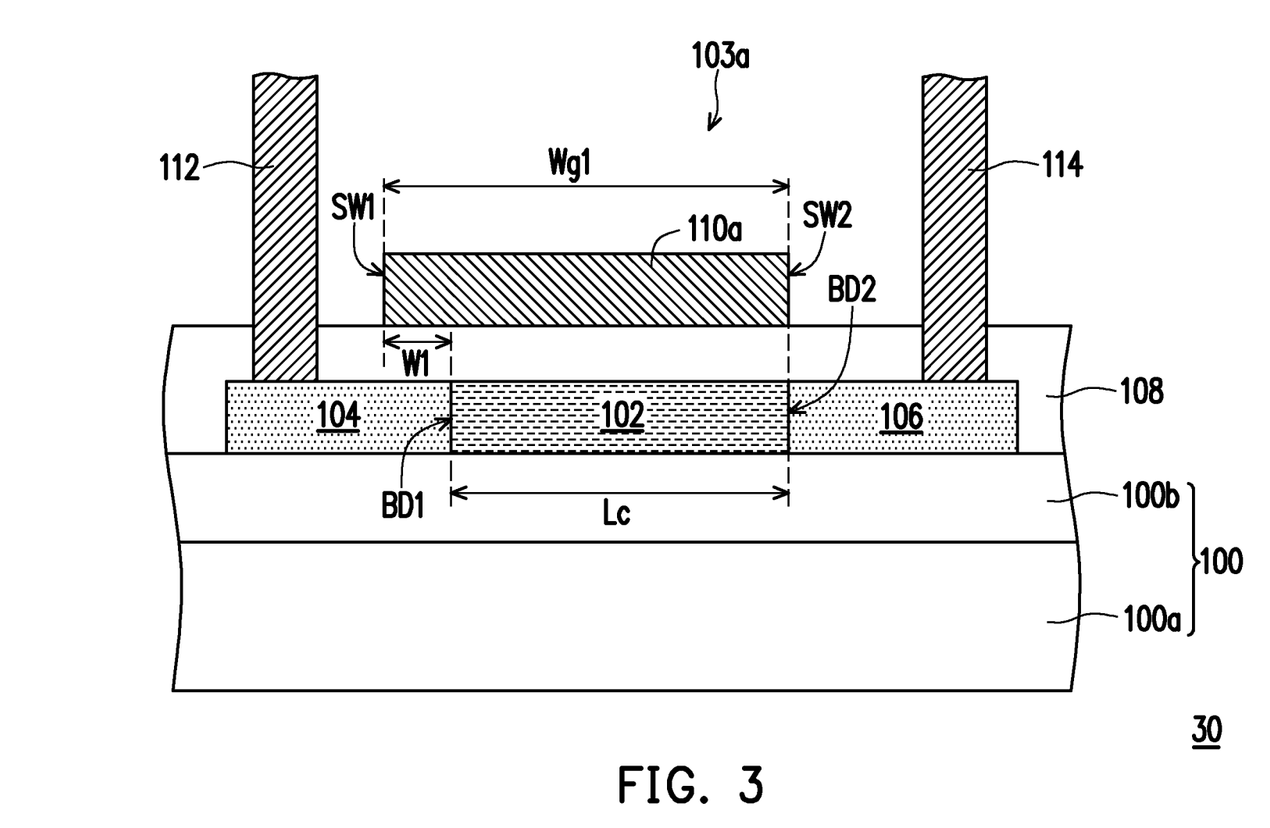
FIG. 3 is a schematic cross-sectional view of a memory device according to a third embodiment of the present invention.

FIG. 3 is a schematic cross-sectional view of a memory device according to a third embodiment of the present invention. Referring to FIG. 3, the difference between the present embodiment and the first embodiment is that: the memory device 30 of the present embodiment includes a memory structure 103a including a floating gate 110a having a larger width Wg1.

In the present embodiment, the floating gate 110a extends to the top of the first doped region 104, so that the floating gate 110a and the first doped region 104 are partially overlapped to enlarge the overlap area between the floating gate 110a and the first doped region 104. That is, the sidewall SW2 of the floating gate 110a adjacent to the second doped region 106 is substantially aligned with the boundary BD2 between the second doped region 106 and the channel region 102, and the sidewall SW1 of the floating gate 110a adjacent to the first doped region 104 is not aligned with the boundary BD1 between the first doped region 104 and the channel region 102, from the top view.

In the present embodiment, the floating gate 110a extends a width W1 on the first doped region 104. Thus, compared to the floating gate 110 included in the memory structure 103, the floating gate 110a has a larger width. As a result, the width Wg1 of the floating gate 110a is the sum of the width W1 and the width Wg of the floating gate 110 (or the channel length Lc). In this way, without changing the design of the first doped region 104 and the second doped region 106 (the width of the first doped region 104 is substantially equal to the width of the second doped region 106), by controlling the overlap area between the floating gate 110a and the first doped region 104, the coupling effect between the floating gate 110a and the first doped region 104 may be effectively improved since the coupling ratio is increased.

When the overlap area between the floating gate 110 and the first doped region 104 is too small, the coupling effect between the floating gate 110 and the first doped region 104 may not be effectively improved. When the overlap area between the floating gate 110 and the first doped region 104 is too large, in addition to being unable to further improve the coupling effect between the floating gate 110 and the first doped region 104, the layout design of the memory device may be affected due to the excessive size of the floating gate 110a. In the present embodiment, the width W1 of the overlap of the floating gate 110a and the first doped region 104 is between 0.2 and 2 times, preferably between 0.25 and 1.5 times, the channel length Lc of the channel region 102. Within the range, the coupling effect between the floating gate 110a and the first doped region 104 may be effectively improved, and the dimension of the floating gate 110a may not be too large to affect the layout design of the memory device. For example, when the channel length Lc of the channel region 102 is about 4.5 µm, the width W1 may be between 0.9 µm and 9 µm, preferably between 1.125 µm and 6.75 µm.

The memory device 30 may effectively improve the weak-program or the stuck bit during the program operation, which will be explained below.

During the program operation, when the memory device 30 may be subjected to the weak-program, since the floating gate 110a and the first doped region 104 are partially overlapped, the first doped region 104 may be used as the source, and thus the coupling ratio at the source may be increased. As a result, the weak-program may be improved. For example, to improve the weak-program, the first doped region 104 is used as the source and received a first voltage through the conductive line 112 (source line) and the second doped region 106 is used as the drain and received a second voltage lower than the first voltage through the conductive line 114 (bit line), to lower initial electron injection point to inject more electrons. In this way, the weak-program may be effectively improved. For example, the first voltage may be at $V_{PP}$ level and the second voltage may be 0 V, in which $V_{PP}$ is a positive value. For another example, the first voltage may be 0 V and the second voltage may be at $-V_{PP}$ level.

During the program operation of the memory device 30, compared with the memory device including a memory structure in which the sidewalls of the floating gate are substantially aligned with the boundaries between the doped regions and the channel region (the leakage current (Ioff) is $1\times10^{-10}$ A, the discharge current (Ion) is $18\times10^{-6}$ A), the memory device 30 may have a lower leakage current ($3\times10^{-11}$ A) and a higher discharge current ($24\times10^{-6}$ A), obtaining a nearly 33% improvement in operating performance.

In addition, during the program operation, when the memory device 30 may be subjected to the stuck bit, since the floating gate 110a and the first doped region 104 are partially overlapped, the first doped region 104 may be used as the drain, and thus the coupling ratio at the drain may be increased. As a result, the stuck bit may be improved. For example, to improve the stuck bit, the first doped region 104 is used as the drain and received a first voltage through the conductive line 112 (bit line) and the second doped region 106 is used as the source and received a second voltage higher than the first voltage through the conductive line 114 (source line), to properly adjust a higher initial electron injection point. In this way, the stuck bit may be effectively improved.

Figure 4:
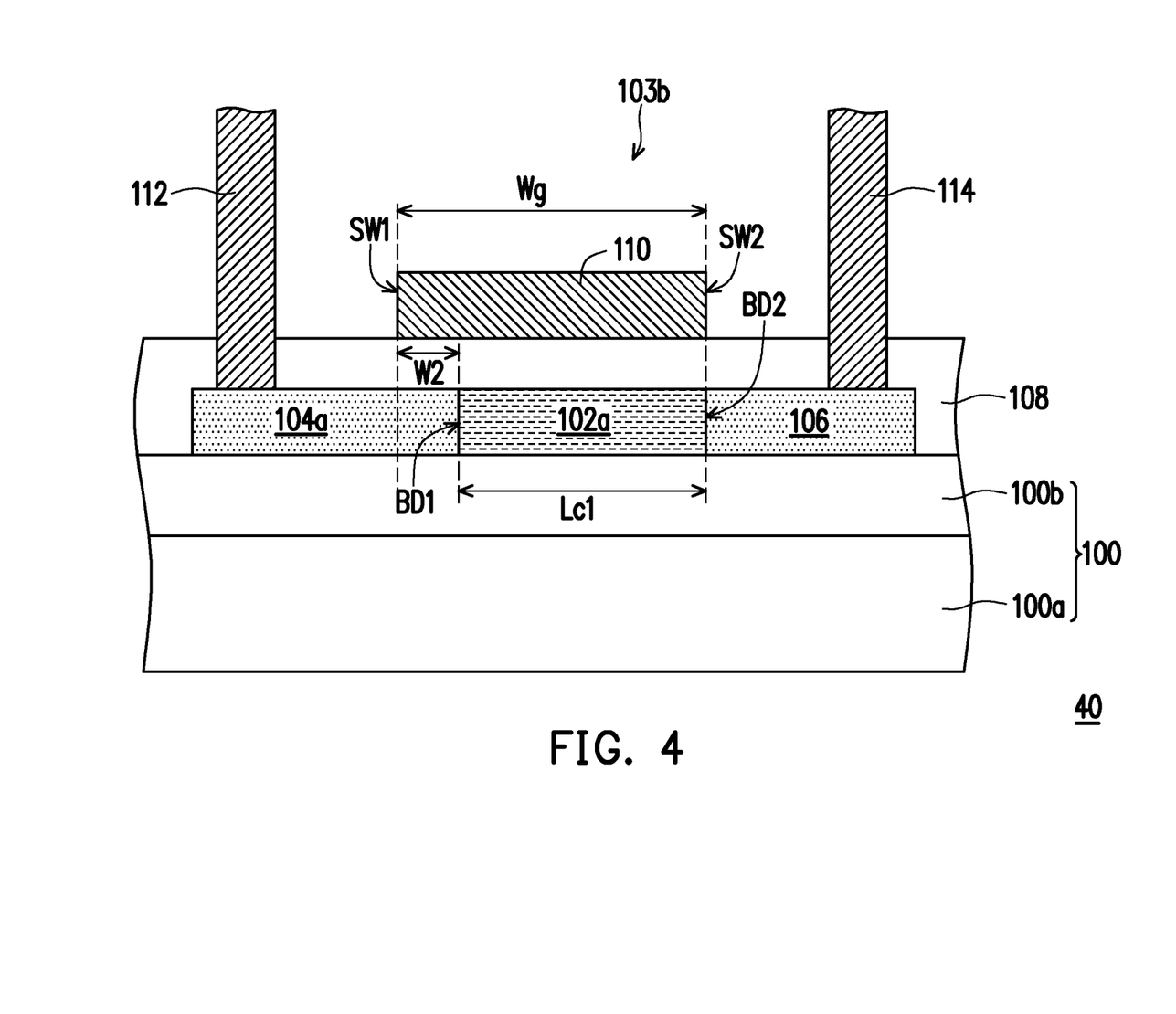
FIG. 4 is a schematic cross-sectional view of a memory device according to a fourth embodiment of the present invention.

FIG. 4 is a schematic cross-sectional view of a memory device according to a fourth embodiment of the present invention. Referring to FIG. 4, the difference between the present embodiment and the first embodiment is that: the memory device 40 of the present embodiment includes a memory structure 103b including a channel region 102a having a smaller channel length Lc1 and a first doped region 104a having a larger width.

In the present embodiment, the first doped region 104a extends into a region below the floating gate 110, so that the floating gate 110 and the first doped region 104a are partially overlapped to enlarge the overlap area between the floating gate 110 and the first doped region 104a. That is, the sidewall SW2 of the floating gate 110 adjacent to the second doped region 106 is substantially aligned with the boundary BD2 between the second doped region 106 and the channel region 102a, and the sidewall SW1 of the floating gate 110 adjacent to the first doped region 104a is not aligned with the boundary BD1 between the first doped region 104a and the channel region 102a, from the top view.

In the present embodiment, the first doped region 104a extends a width W2 below the floating gate 110, so that the width of the first doped region 104a is larger than the width of the second doped region 106. Thus, compared to the channel region 102 included in the memory structure 103, the channel region 102a has a smaller channel length. As a result, the channel length Lc1 of the channel region 102a is of the width Wg of the floating gate 110 (or the channel length Lc) minus the width W2. In this way, without changing the design of the floating gate 110 and the second doped region 106, by controlling the overlap area between the floating gate 110 and the first doped region 104a, the coupling effect between the floating gate 110 and the first doped region 104a may be effectively improved since the coupling ratio is increased.

In the present embodiment, the width W2 of the overlap of the floating gate 110a and the first doped region 104a is between 0.2 and 0.5 times, preferably between 0.25 and 0.3 times, the width Wg of the floating gate 110. Within the range, the coupling effect between the floating gate 110 and the first doped region 104a may be effectively improved, and the channel length of the channel region 102a may not be too short to affect the performance of the memory device. For example, when the width Wg1 of the floating gate 110 is about 4.5 µm, the width W2 may be between 0.9 µm and 2.25 µm, preferably between 1.125 µm and 1.35 µm.

Similar as the memory device 30, since the floating gate 110 and the first doped region 104a are partially overlapped to enlarge the overlap area between the floating gate 110 and the first doped region 104a, the weak-program or the stuck bit may be effectively improved.

The program operation of memory device 40 is similar to that of memory device 30, and thus it will not be described separately.

Figure 5A:
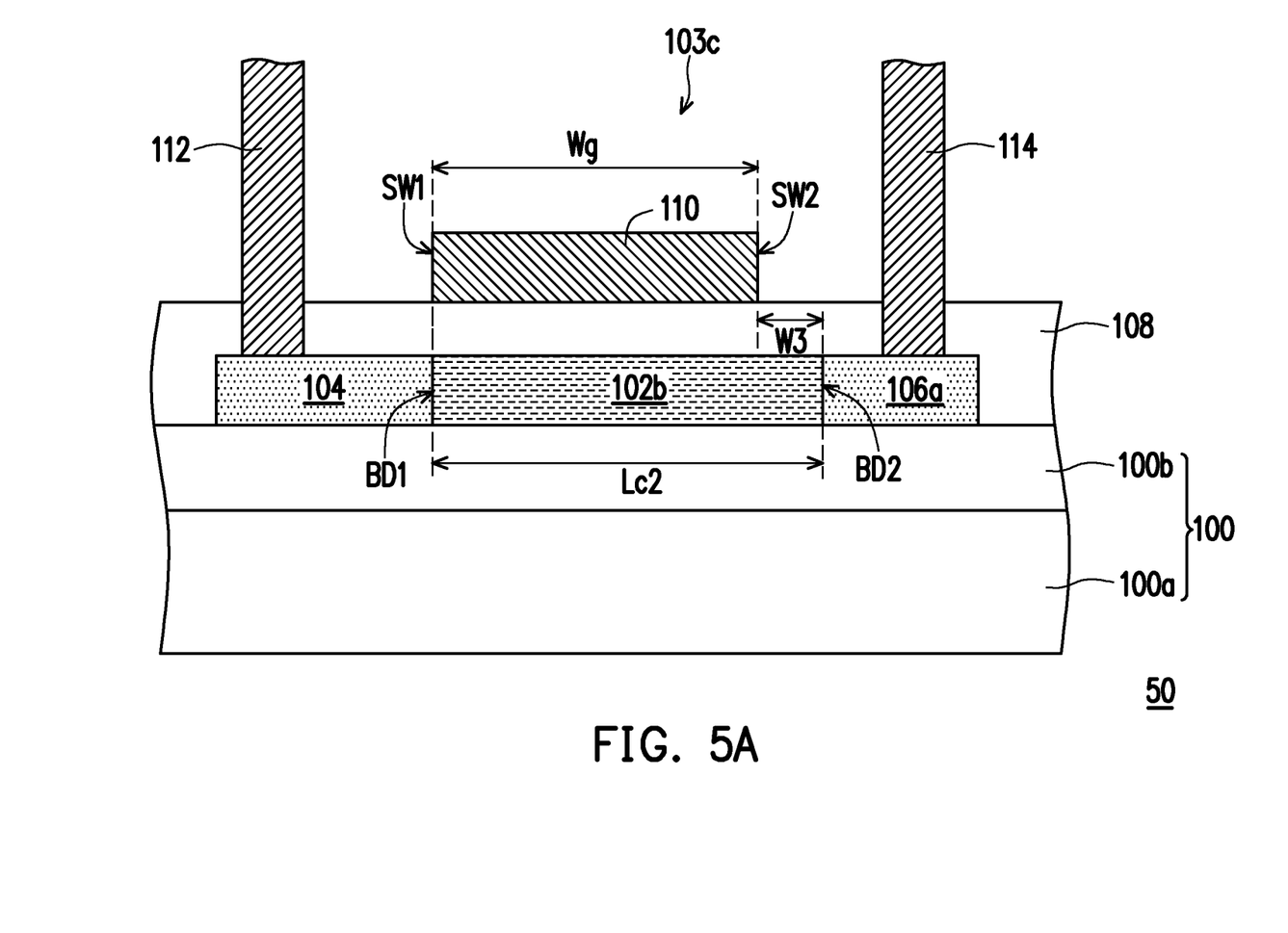
FIG. 5A is a schematic cross-sectional view of a memory device according to a fifth embodiment of the present invention.

FIG. 5A is a schematic cross-sectional view of a memory device according to a fifth embodiment of the present invention. Referring to FIG. 5A, the difference between the present embodiment and the first embodiment is that: the memory device 50 of the present embodiment includes a memory structure 103c including a channel region 102b having a larger channel length Lc2 and a second doped region 106a having a smaller width than the first doped region 104.

In the present embodiment, the channel region 102b extends from the sidewall SW2 of the floating gate 110, so that the sidewall of the floating gate 110 and the second doped region 106a are separated by a distance, and the width of the second doped region 106a is smaller than the width of the second doped region 106. That is, the sidewall SW1 of the floating gate 110 adjacent to the first doped region 104 is substantially aligned with the boundary BD1 between the first doped region 104 and the channel region 102b, and the sidewall SW2 of the floating gate 110 adjacent to the second doped region 106 is not aligned with the boundary BD2 between the second doped region 106 and the channel region 102b, from the top view.

Figure 5B:
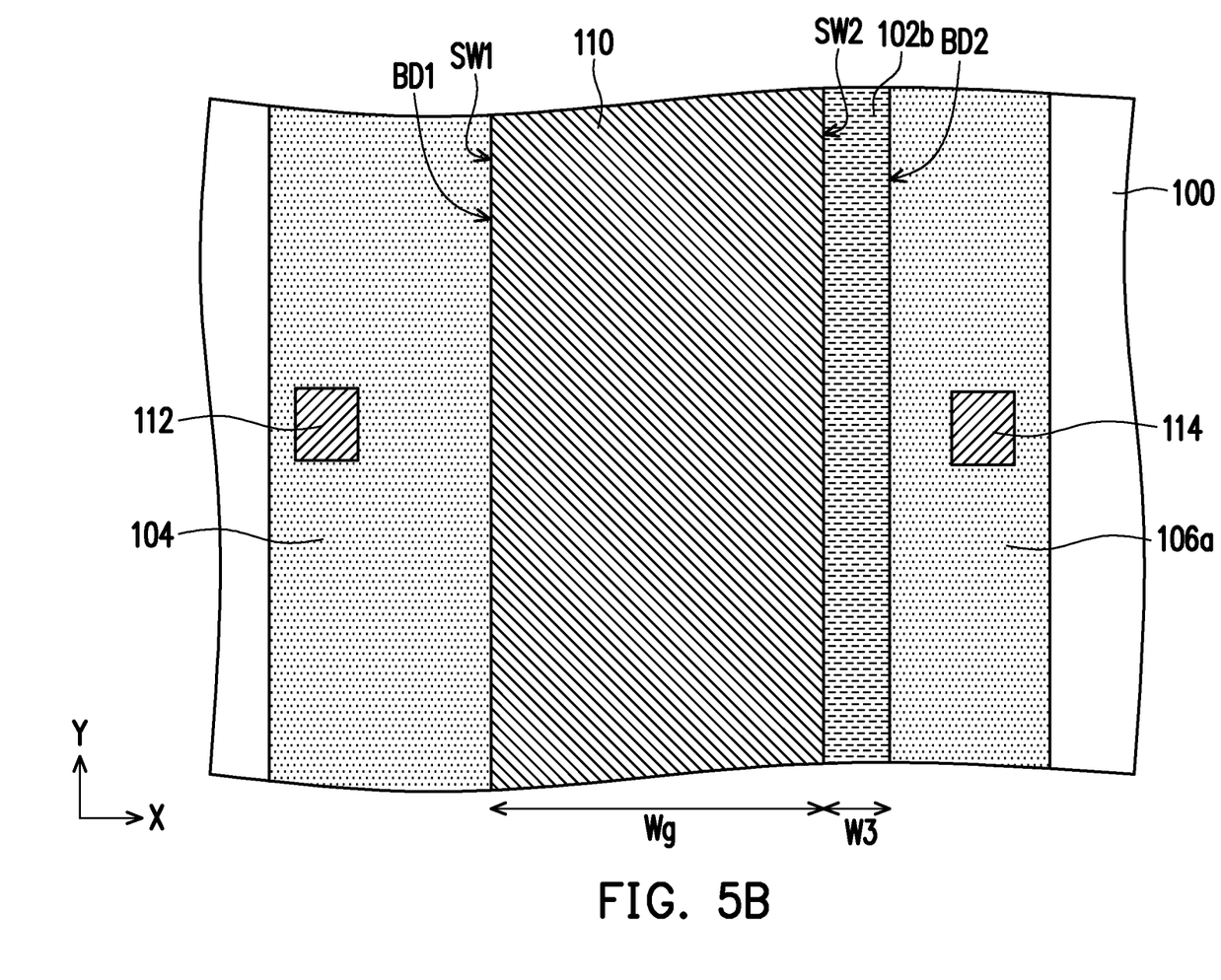
FIG. 5B is a schematic top view of the memory device in FIG. 5A.

FIG. 5B is a schematic top view of the memory device in FIG. 5A. As shown in FIG. 5B, from the top view, the sidewall SW2 of the floating gate 110 and the boundary BD2 between the second doped region 106 and the channel region 102b are separated by a distance W3 in a length direction (X direction) of the channel region 102b. In other words, the floating gate 110 and the second doped region 106 are separated by the distance W3 in a length direction (X direction) of the channel region 102b. Thus, compared to the channel region 102 included in the memory structure 103, the channel region 102b has a larger channel length. As a result, the channel length Lc2 of the channel region 102b is the sum of the distance W3 and the width Wg of the floating gate 110 (or the channel length Lc of the channel region 102). In this way, without changing the design of the first doped region 104 and the floating gate 110, by controlling the distance W3, the coupling effect between the floating gate 110 and the second doped region 106a may be effectively reduced.

In the present embodiment, the distance W3 is between 0.05 and 0.5 times, preferably between 0.1 and 0.2 times, the width Wg of the floating gate 110. Within the above range, the coupling effect between the floating gate 110 and the second doped region 106 may be effectively reduced, and the dimension of the channel region 102b may not be too large to affect the layout design of the memory device. For example, when the width Wg is about 4.5 μm, the distance W3 may be between 0.225 μm and 2.25 μm, preferably between 0.45 μm and 0.9 μm.

During the program operation, when the memory device 50 may be subjected to the weak-program, since the sidewall SW2 of the floating gate 110 and the boundary BD2 between the second doped region 106 and the channel region 102b are separated by a distance W3 to enlarge the distance between the floating gate 110 and the second doped region 106, the second doped region 106 may be used as the drain, and thus the coupling ratio at the drain may be reduced. As a result, the weak-program may be improved.

In addition, during the program operation, when the memory device 50 may be subjected to the stuck bit, since the sidewall SW2 of the floating gate 110 and the boundary BD2 between the second doped region 106 and the channel region 102b are separated by a distance W3 to enlarge the distance between the floating gate 110 and the second doped region 106, the second doped region 106 may be used as the source, and thus the coupling ratio at the source may be reduced. As a result, the stuck bit may be improved.

The program operation of memory device 50 is similar to that of memory device 30, and thus it will not be described separately.

Figure 6:
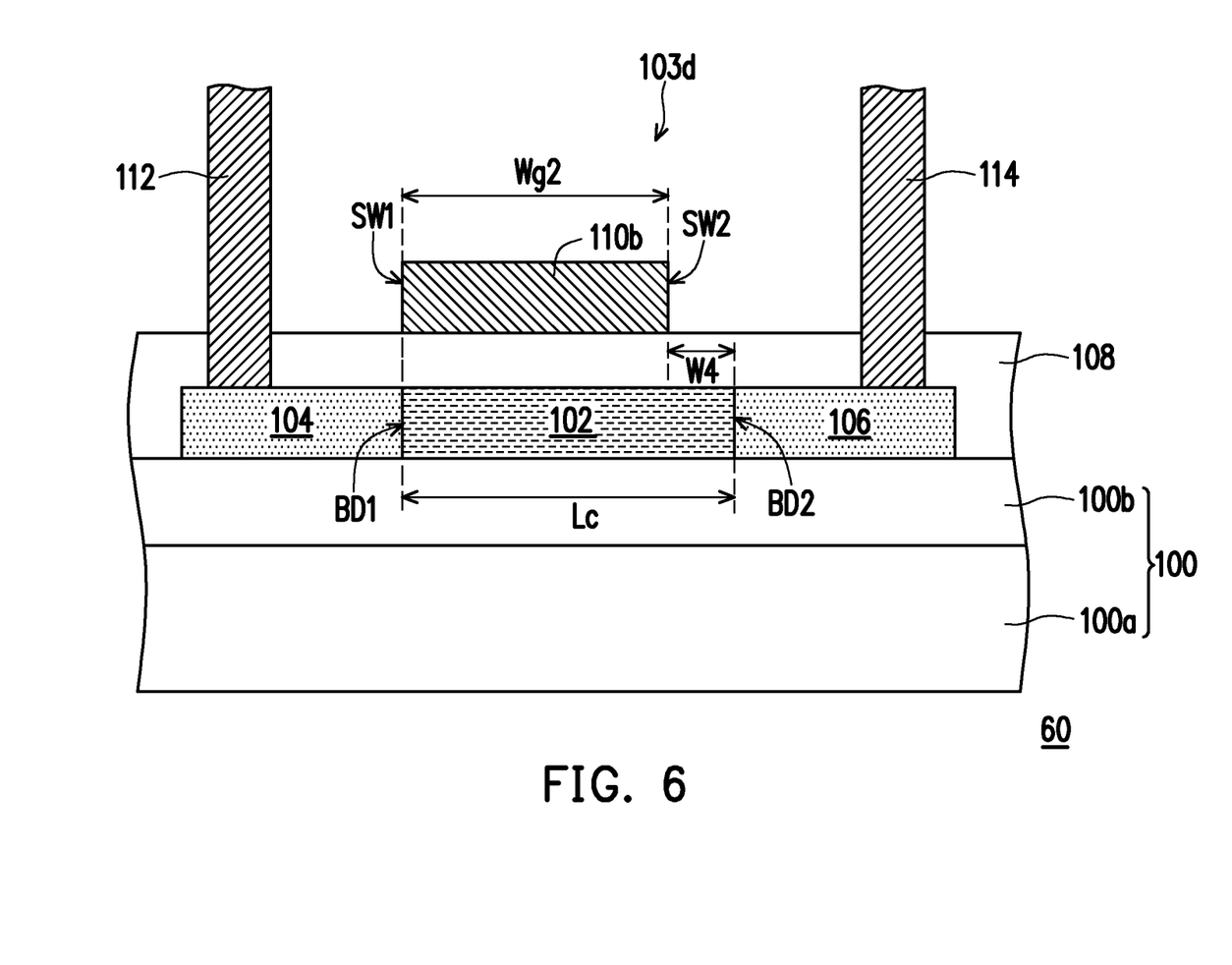
FIG. 6 is a schematic cross-sectional view of a memory device according to a sixth embodiment of the present invention.

FIG. 6 is a schematic cross-sectional view of a memory device according to a sixth embodiment of the present invention. Referring to FIG. 6, the difference between the present embodiment and the first embodiment is that: the memory device 60 of the present embodiment includes a memory structure 103d including a floating gate 110b having a smaller width Wg2.

In the present embodiment, the floating gate 110b shrinks from the boundary between the second doped region 106 and the channel region 102, so that the floating gate 110b and the second doped region 106 are separated by a distance. That is, the sidewall SW1 of the floating gate 110b adjacent to the first doped region 104 is substantially aligned with the boundary BD1 between the first doped region 104 and the channel region 102, and the sidewall SW2 of the floating gate 110b adjacent to the second doped region 106 is not aligned with the boundary BD2 between the second doped region 106 and the channel region 102, from the top view.

In the present embodiment, the sidewall SW2 of the floating gate 110b and the boundary BD2 between the second doped region 106 and the channel region 102 are separated by a distance W4 in a length direction (X direction in FIG. 5B) of the channel region 102. In other words, the floating gate 110b and the second doped region 106 are separated by the distance W4 in a length direction (X direction in FIG. 5B) of the channel region 102. Thus, compared to the floating gate 110 included in the memory structure 103, the floating gate 110b has a smaller width. As a result, the width Wg2 of the floating gate 110b is of the channel length Lc of the channel region 102 (or the width Wg of the floating gate 110) minus the distance W4. In this way, without changing the design of the first doped region 104 and the second doped region 106 (the width of the first doped region 104 is substantially equal to the width of the second doped region 106), by controlling the distance W4, the coupling effect between the floating gate 110b and the second doped region 106 may be effectively reduced.

In the present embodiment, the distance W4 is between 0.05 and 0.5 times preferably between 0.1 and 0.2 times, the channel length Lc of the channel region 102. Within the above range, the coupling effect between the floating gate 110b and the second doped region 106 may be effectively reduced, and the width of the floating gate 110b may not be may not be too small to affect the performance of the memory device. For example, when the channel length Lc of the channel region 102 is about 4.5 μm, the distance W4 may be between 0.225 μm and 2.25 μm, preferably between 0.45 μm and 0.9 μm.

Similar as the memory device 50, since the sidewall SW2 of the floating gate 110 and the boundary BD2 between the second doped region 106 and the channel region 102b are separated by a distance W4 to enlarge the distance between the floating gate 110b and the second doped region 106, the weak-program or the stuck bit may be effectively improved.

The program operation of memory device 60 is similar to that of memory device 30, and thus it will not be described separately.

Figure 7:
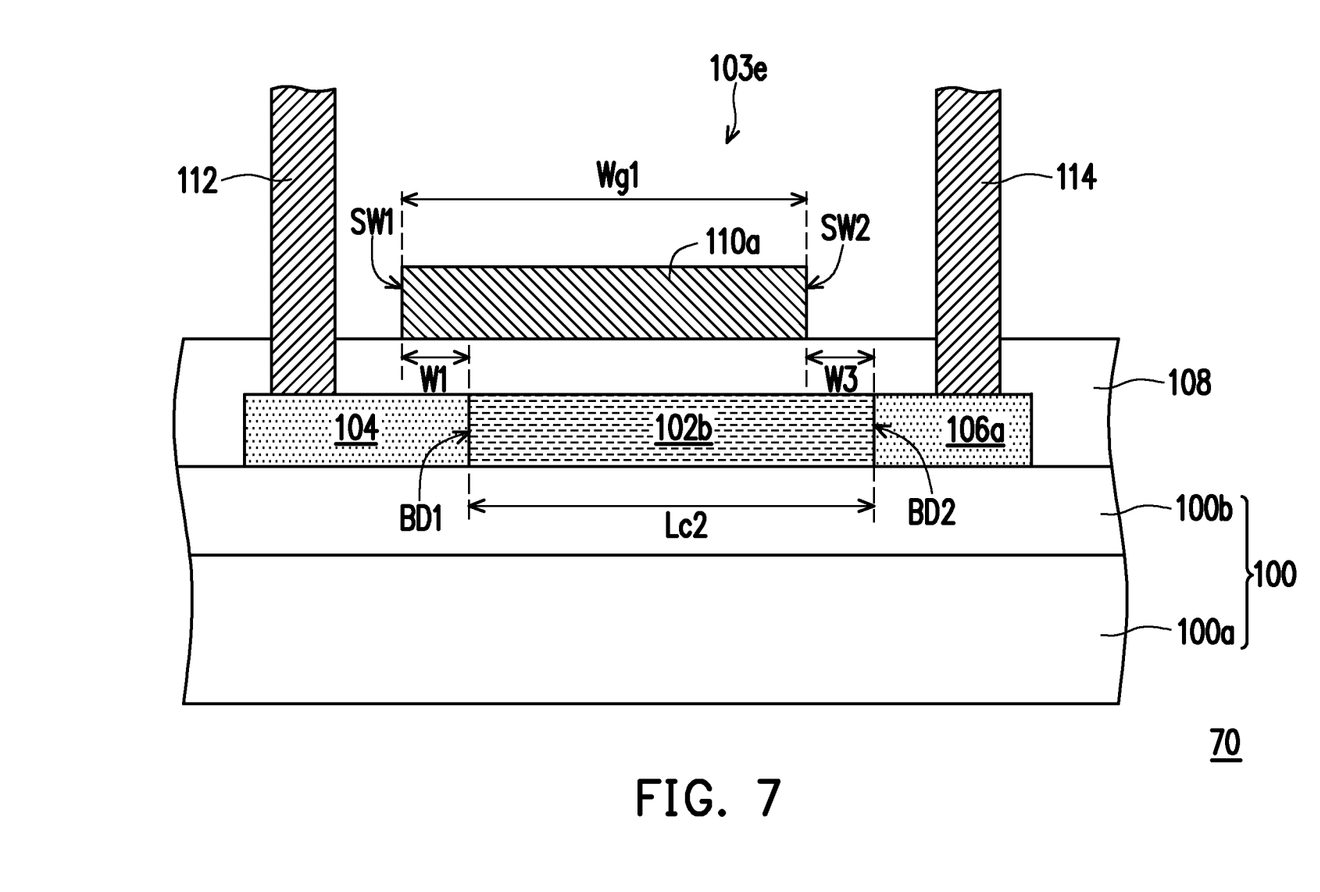
FIG. 7 is a schematic cross-sectional view of a memory device according to a seventh embodiment of the present invention.

FIG. 7 is a schematic cross-sectional view of a memory device according to a seventh embodiment of the present invention. In the present embodiment, the third embodiment is combined with the fifth embodiment. Referring to FIG. 7, the difference between the present embodiment and the first embodiment is that: the memory device 70 of the present embodiment includes a memory structure 103e including the floating gate 110a having a larger width Wg1, the channel region 102b having a larger channel length Lc2 and the second doped region 106a having a smaller width.

In the present embodiment, since the overlap area between the floating gate 110a and the first doped region 104 are enlarged and the distance between the floating gate 110a and the second doped region 106a is enlarged, the weak-program or the stuck bit may be effectively improved.

Similarly, depending on actual needs, the above embodiments may be combined to enlarge the overlap area between the floating gate and the first doped region and enlarge the distance between the floating gate and the second doped region for effectively improving the weak-program or the stuck bit.

In addition, as in the second embodiment, the memory device of each of the above embodiments may further include a select transistor disposed to be connected in series with the memory structure.

Figure 8:
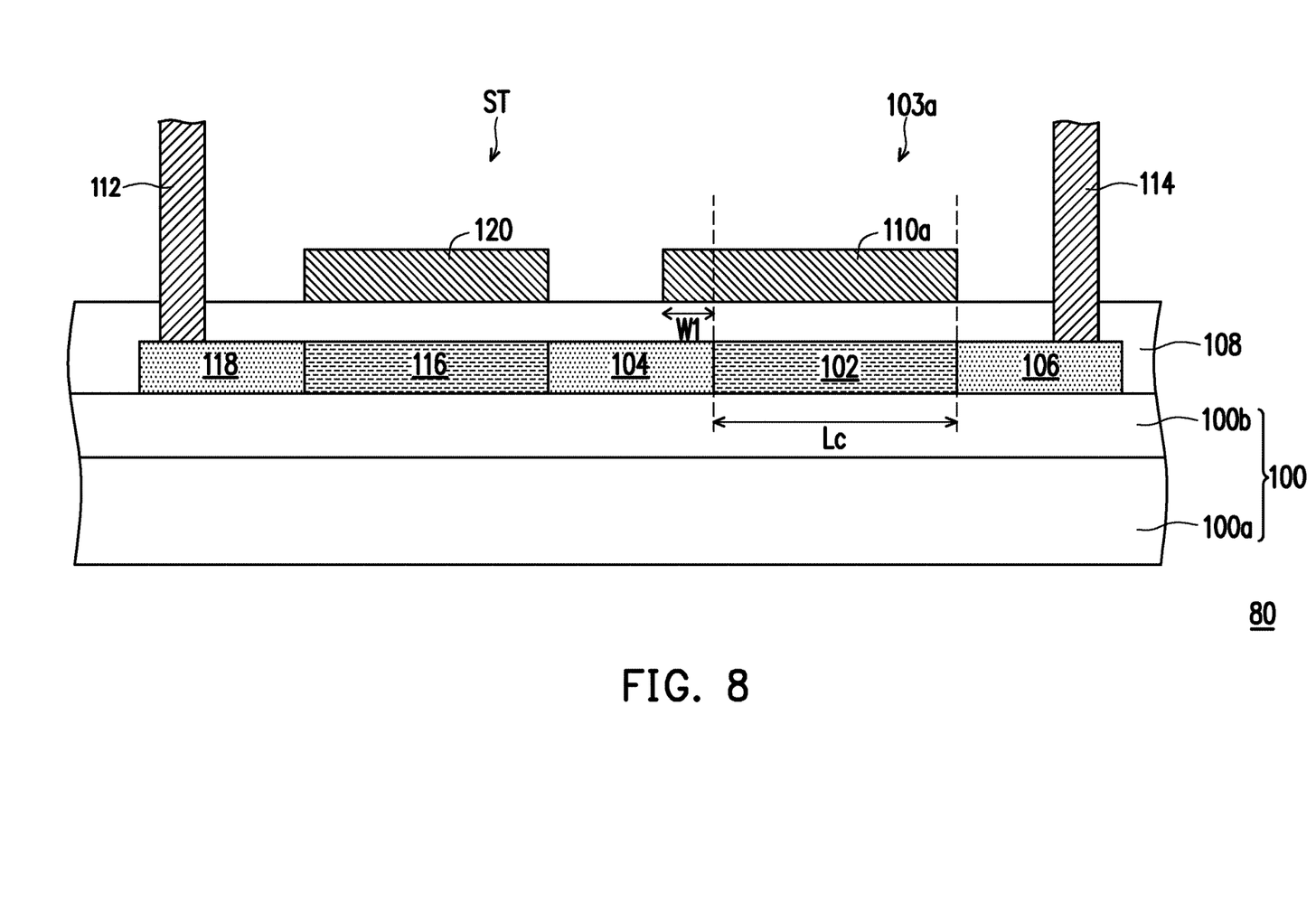
FIG. 8 is a schematic cross-sectional view of a memory device according to an eighth embodiment of the present invention.

For example, similar to the memory device 20, the memory device 80 may include memory structure 103a, the conductive line 112, the conductive line 114 and the select transistor ST, as shown in FIG. 8. The first doped region 104 is shared by the memory structure 103a and the select transistor ST. The conductive line 112 is connected to the third doped region 118 of the select transistor ST.

In the present embodiment, during the program operation, when the memory device 80 may be subjected to the weak-program, since the overlap area between the floating gate 110a and the first doped region 104 are enlarged, the first doped region 104 may be used as the source and the select transistor ST is disposed between the source of the memory structure 103a and the conductive line 112 used as the source line, and thus the coupling ratio at the source may be increased. As a result, the weak-program may be improved.

Figure 9:
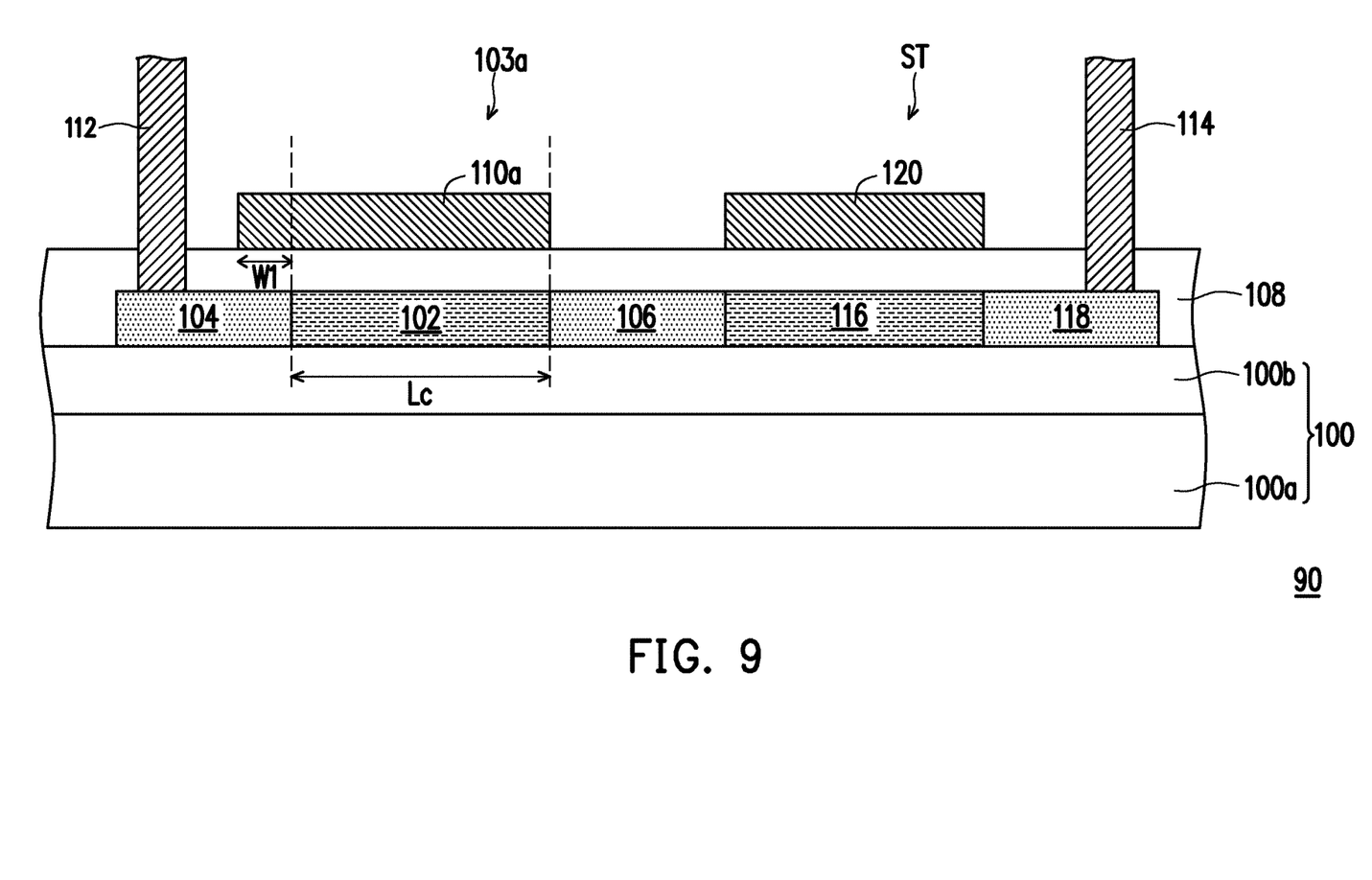
FIG. 9 is a schematic cross-sectional view of a memory device according to n ninth embodiment of the present invention.

In another embodiment, as shown in FIG. 9, in the memory device 90, the second doped region 106 is shared by the memory structure 103a and the select transistor ST. The conductive line 114 is connected to the third doped region 118 of the select transistor ST. During the program operation, when the memory device 90 may be subjected to the stuck bit, since the overlap area between the floating gate 110a and the first doped region 104 are enlarged, the first doped region 104 may be used as the drain and the select transistor ST is disposed between the source of the memory structure 103a and the conductive line 114 used as the source line, and thus the coupling ratio at the drain may be increased. As a result, the stuck bit may be improved.

Similarly, depending on actual needs, each of the above memory structures 103b to 103e may be included in a memory device together with the select transistor ST.

In other embodiments, depending on actual needs, the above memory structures may include a spacer disposed on the sidewall of the floating gate. In addition, depending on actual needs, the above memory structures may be integrated with other semiconductor structures in a memory device.

To be noticed, the embodiments described above may be implemented preferably in a thin film transistor (TFT) process, but the present invention is not limited thereto.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising: a memory structure, comprising: a substrate; a channel region, disposed on the substrate; a first doped region and a second doped region, disposed on the substrate and respectively located at two sides of the channel region; a floating gate, disposed on the channel region; and a dielectric layer, disposed between the floating gate and the channel region, the first doped region and the second doped region, wherein a coupling ratio between the floating gate and the first doped region is greater than a coupling ratio between the floating gate and the second doped region, wherein the floating gate and the second doped region are not overlapped, and a sidewall of the floating gate adjacent to the second doped region and a boundary between the second doped region and the channel region are separated by a distance in a length direction of the channel region, or wherein the floating gate and the first doped region are partially overlapped, the floating gate and the second doped region are not overlapped, and a sidewall of the floating gate adjacent to the second doped region and a boundary between the second doped region and the channel region are separated by a distance in a length direction of the channel region.

2. The memory device of claim 1, wherein a width of the first doped region overlapped with the floating gate is between 0.2 times and 2 times a length of the channel region.

3. The memory device of claim 2, wherein a width of the first doped region is substantially equal to a width of the second doped region.

4. The memory device of claim 1, wherein a width of the first doped region overlapped with the floating gate is between 0.2 and 0.5 times a width of the floating gate.

5. The memory device of claim 4, wherein a width of the first doped region is larger than a width of the second doped region.

6. The memory device of claim 1, wherein a width the first doped layer overlapped with the floating gate is between 0.9 μm and 9 μm.

7. The memory device of claim 1, wherein the distance is between 0.05 and 0.5 times a width of the floating gate.

8. The memory device of claim 7, wherein a width of the second doped region is smaller than a width of the first doped region.

9. The memory device of claim 1, wherein the distance is between 0.05 and 0.5 times a length of the channel region.

10. The memory device of claim 9, wherein a width of the first doped region is substantially equal to a width of the second doped region.

11. The memory structure of claim 1, wherein the distance is between 0.225 μm and 2.25 μm.

12. The memory device of claim 1, wherein a dopant concentration of the first doped region is the same as a dopant concentration of the second doped region.

13. The memory device of claim 1, wherein the channel region is undoped.

14. The memory device of claim 1, wherein the substrate comprises a glass substrate and a buffer layer disposed on the glass substrate.

15. The memory device of claim 1, further comprising a select transistor disposed to be connected in series with the memory structure.

16. The memory device of claim 1, further comprising a source line connected with the first doped region and a bit line connected to the second doped region, wherein during a program operation of the memory device, the first doped region is configured to receive a first voltage through the source line, the second doped region is configured to receive a second voltage through the bit line, and the first voltage is higher than the second voltage.

17. The memory device of claim 1, further comprising a bit line connected with the first doped region and a source line connected to the second doped region, wherein during a program operation of the memory device, the first doped region is configured to receive a first voltage through the bit line, the second doped region is configured to receive a second voltage through the source line, and the first voltage is lower than the second voltage.

18. A memory device, comprising:
a memory structure, comprising:
a substrate;
a channel region, disposed on the substrate;
a first doped region and a second doped region, disposed on the substrate and respectively located at two sides of the channel region;
a floating gate, disposed on the channel region; and
a dielectric layer, disposed between the floating gate and the channel region, the first doped region and the second doped region,
wherein the floating gate and the second doped region are not overlapped, and a sidewall of the floating gate adjacent to the second doped region and a boundary between the second doped region and the channel region are separated by a distance in a length direction of the channel region.

* * * * *